US010261160B2

(12) United States Patent
Muhlsteff et al.

(10) Patent No.: US 10,261,160 B2
(45) Date of Patent: Apr. 16, 2019

(54) ECG-BASED TRIGGERING FOR MAGNETIC RESONANCE IMAGING

(71) Applicant: KONINKLIJKE PHILIPS N.V., Eindhoven (NL)

(72) Inventors: Jens Muhlsteff, Eindhoven (NL); Roy Johannes Hendrikus Gerardus Creemers, Eindhoven (NL); Julia Philipp, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 316 days.

(21) Appl. No.: 14/909,483

(22) PCT Filed: Aug. 7, 2014

(86) PCT No.: PCT/EP2014/066950
§ 371 (c)(1),
(2) Date: Feb. 2, 2016

(87) PCT Pub. No.: WO2015/018879
PCT Pub. Date: Feb. 12, 2015

(65) Prior Publication Data
US 2016/0202337 A1    Jul. 14, 2016

(30) Foreign Application Priority Data

Aug. 7, 2013  (EP) ..................................... 13179571

(51) Int. Cl.
*G01R 33/56*     (2006.01)
*G01R 33/567*   (2006.01)
(52) U.S. Cl.
CPC ................ *G01R 33/5673* (2013.01)

(58) Field of Classification Search
CPC ..... A61B 5/0456; A61B 5/055; A61B 5/7285; A61B 5/7289; A61B 5/0263; A61B 6/541;
(Continued)

(56) References Cited

U.S. PATENT DOCUMENTS 5,987,348 A    11/1999  Fischer et al.
2003/0220578 A1  11/2003  Ho et al.
(Continued)

FOREIGN PATENT DOCUMENTS

EP    0925019 B1    6/1999
WO   9904688 A1    2/1999

OTHER PUBLICATIONS

Abi-Abdallah et al, "Alterations in Human ACG Due to the Magnetohydrodynamic Effect . . ." Proceedings of the 29th Annual International Conf. of the IEEE EMBS Cite International, Aug. 23-26 p. 1842-1845.
(Continued)

*Primary Examiner* — Rodney A Bonnette (57) ABSTRACT

A method of imaging, by means of magnetic resonance, at least a portion of a human or animal subject of interest (20) positioned in a static magnetic field, the method comprising: —taking measurements of electrocardiogram data; —generate vector cardiogram data from the electrocardiogram data; —determining at least one parameter of an acquisition period of acquiring magnetic resonance signals from the vector cardiogram data in order to synchronize measurement of magnetic resonance signals to a cyclic movement of the heart of the subject of interest (20); wherein the at least one parameter of the acquisition period is determined from an actual value of a discriminating function and a predetermined reference function, wherein for determining the at (Continued)

least one parameter of the acquisition period, a step of adapting at least one of the discriminating function and the predetermined reference function is executed, dependent on a breathing status of the human or animal subject of interest (20); and—a magnetic resonance imaging system (10) for acquisition of images of at least a portion of a human or animal subject of interest (20), synchronized to a cyclic movement of the heart of the subject of interest (20), comprising: —a control unit (28) for controlling functions of the magnetic resonance imaging system (10); —an image processing unit (34) provided for processing acquired magnetic resonance signals; —an electrocardiogram device (36) for taking measurements of electrocardiogram data of the heart of the subject of interest (20); —a synchronization unit (40) coupled to the electrocardiogram device (36) and configured for determining at least one parameter of an acquisition period from the vector cardiogram data, wherein the synchronization unit (40) is configured to provide trigger signals (60) indicative of the determined at least one parameter of the acquisition period to the control unit (28); and wherein the synchronization unit (40) is configured to adapt at least one of the discriminating function and the predetermined reference function, dependent on a breathing status of the human or animal subject of interest (20).

19 Claims, 4 Drawing Sheets (58) Field of Classification Search
CPC ... A61B 5/0408; A61B 5/7203; A61B 5/7292; A61B 6/5288; A61B 5/04011; A61B 6/032; G01R 33/5673
See application file for complete search history.

(56) References Cited

U.S. PATENT DOCUMENTS

2006/0122490 A1 6/2006 Sha et al.
2007/0092123 A1 4/2007 Popescu

OTHER PUBLICATIONS

Dymarkowski et al , "Functional Cardiac MRI" Medica Mundi Apr. 2002 p. 46-52.
Fischer et al "Novel Real-Time R-Wave Detection Algorithm Based on the Vectorcardiogram for Accurate Gated Magnetic Resonance Acquisitions" Magnetic Resonance in Medicine 42: p. 361-370 (1999).
Nijm et al, "Comparison of Signal Peak Detection Algorithms for Self-Gated Cardiac Cine MRI" Computers in Cardiology 2007 p. 407-410.
Muthupillai et al "Sense or K-MAG to Accelerate Free Breathing Navigator-Guided Coronary MR Angiography", AJR: 186, Jun. 2006.
Sha et al "An R-Wave Detection Algorithm for Cardiac MR Acquisitions Using Morphological Feature" Proc. Intl. Soc. Mag. Reson. Med 13 (2005) p. 1642.
Fischer et al "Cardiac Triggering At 3.0 Tesla" Proc. Intl. Soc. Mag. Reson. Med 9 (2001) p. 1826.
J.M. Chia, S.E. Fischer, S.A. Wickline: 'Performance of QRS Detection for Cardiac Magnetic Resonance Imaging With a Novel Vectorcardiographic Triggering Method', Journal of Magentic Resonance Imaging 12, pp. 678-688, Nov. 2000.
T. Niendorf, L. Winter, T. Frauenrath: 'Electrocardiogram in an MRI Environment: Clinical Needs, Practical Considerations, Safety Implications, Technical Solutions and Future Directions', Advances in Electrocardiograms—Methods and Analysis, pp. 309-324, Jan. 2012.
W.A.H. Engelse, C. Zeelenberg: 'A Single Scan Algorithm for QRS-Detection and Feature Extraction', Computers in Cardiology 6, pp. 37-42, Sep. 1979.

FIG. 6

ECG-BASED TRIGGERING FOR MAGNETIC RESONANCE IMAGING

CROSS REFERENCE TO RELATED APPLICATIONS

This application is a U.S. national phase application of International Application No. PCT/EP2014/066950, filed on Aug. 7, 2014, which claims the benefit of EP Application Serial No. 13179571.8 filed on Aug. 7, 2013 and is incorporated herein by reference.

FIELD OF THE INVENTION

The invention pertains to a method of imaging, by means of magnetic resonance, at least a portion of a human or animal subject of interest positioned in a static magnetic field, and a magnetic resonance imaging system for acquisition of images of at least a portion of a subject of interest, synchronized to a cyclic movement of the heart of the subject of interest.

BACKGROUND OF THE INVENTION

In the field of applying magnetic resonance imaging methods for the purposes of cardiology, it is known that a magnetic resonance image usually cannot be acquired during one single heart cycle but by repetitive acquisition of magnetic resonance signals, wherein the repetitive acquisition is synchronized to a cyclic movement of the heart.

For instance, the synchronization of the repetitive acquisition of magnetic resonance signals can be conducted with respect to the prominent R-wave of the QRS-complex of an electrocardiogram signal to ensure that each portion of the magnetic resonance image is acquired at the same phase of the cardiac cycle. However, sources of noise, such as magneto-hydrodynamic effects and magnetic gradient field distortions, give rise to synchronization issues.

To overcome these issues, it has been proposed in EP 0 925 019 B1 to determine an acquisition period of the magnetic resonance imaging system from a vector cardiogram obtained from the measurement of electrocardiogram data, by comparing an actual value of a discriminating function of the vector cardiogram, which is based on an angular relationship between the determined electrical axis of the heart and an instantaneous vector of the vector cardiogram, and a predetermined reference function. In one embodiment described in EP 0 925 019 B1, the discriminating function is defined as the scalar product of the instantaneous vector of the vector cardiogram and the electrical axis of the heart. The predetermined reference function may be a fixed threshold of a maximum amplitude of the discrimination function.

US2007/0092123A1 describes a method and device for movement correction when imaging the heart. From measured vector cardiograms a variation in the spatial position of the heart between heart periods is calculated. The calculated variation is taken into account when combining different pictures in order to avoid or at least reduce errors in the combined image date record that are caused by the variation in the spatial position of the heart.

SUMMARY OF THE INVENTION

There is a desire for a further improved method for determining acquisition periods that is able to further reduce the number of erroneous acquisition periods for magnetic resonance imaging scans, in particular for scans that are performed at different phases of breathing of the subject of interest.

It is therefore an object of the invention to provide an improved method of imaging, by means of magnetic resonance, at least a portion of a human or animal subject of interest positioned in a static magnetic field.

The method comprises following steps:
taking measurements of electrocardiogram data of a heart of the subject of interest,
generate vector cardiogram data from the electrocardiogram data including determining an electrical axis of the heart,
determining at least one parameter of an acquisition period of acquiring magnetic resonance signals from the vector cardiogram data in order to synchronize measurement of magnetic resonance signals to a cyclic movement of the heart of the subject of interest,
wherein the at least one parameter of the acquisition period is determined from an actual value of a discriminating function, which is based on an angular relationship between the determined electrical axis of the heart and an instantaneous vector of the vector cardiogram, and a predetermined reference function, which is based on a fixed threshold of the actual value of the discrimination function.

For determining the at least one parameter of the acquisition period, a step of adapting at least one of the discriminating function and the predetermined reference function is executed, dependent on a breathing status of the human or animal subject of interest.

The phrase "adapting at least one of the discriminating function and the predetermined reference function", as used in this application, shall be understood particularly such that the step of adapting is executed on either one of the discriminating function and the predetermined reference function, or is executed on both the discriminating function and the predetermined reference function.

The phrase "parameter of an acquisition period", as used in this application, shall be understood particularly as a start time, a stop time, or time duration of the acquisition period. The parameter can particularly be determined relative to a specified event during the cyclic movement of the heart of the subject of interest, e.g. relative to the heart activity related to the R-peak of the electrocardiogram.

The phrase "vector cardiogram data", as used in this application, shall be understood particularly as a registration of a time course of mean instantaneous spatial cardiac vectors. Characteristic loops of the instantaneous vector which are formed in a measurement space are labeled as P, QRS and T trajectories or loops.

In order to reduce erroneous determination of the at least one parameter of the acquisition periods the electrocardiogram data may be filtered to reduce a noise level of the electrocardiogram data, as is known in the art.

It is an insight of the present invention that the physical heart axis, and therewith the electrical axis of the heart, tilts during breathing of the human or animal subject of interest. During inspiration, the inspiratory muscles contract, the diaphragm descends, and the rib cage rises. During expiration, the inspiratory muscles relax, the diaphragm rises, and the rib cage descends. In an acquired vector cardiogram (FIG. 2), the characteristic loop rotates, depending on the different phases of breathing. The solid line curves in FIG. 2 refer to vector cardiogram data during normal breathing, with detected R-peaks marked by full dots. The dashed line curves represent vector cardiogram data during the extreme condition of a breath holding, frequently occurring in the course of magnetic resonance imaging procedures.

The breathing status of the human or animal subject of interest may be determined from signals of a conventional respirometer, or it may be confirmed by a medical staff member, e.g. after instructing a human subject of interest to hold breath.

By adapting at least one of the discriminating function and a predetermined reference function, the tilting of the instantaneous electrical axis of the heart with regard to the determined electrical heart axis can be considered when determining the at least one parameter of the acquisition period, resulting in a more robust and reliable synchronization of the measurement of magnetic resonance signals to the cyclic movement of the heart of the subject of interest.

One of the advantages of the method is that magnetic resonance measurements can be carried out in a shorter time period while satisfactory image quality is ensured.

Another advantage is that operators of the magnetic resonance imaging system perceive a higher ease-of-use, as peaks that are clearly visible for the operator are reliably detected by the method.

Yet another advantage is that a higher throughput of magnetic resonance imaging sessions per time can be conducted.

In another preferred embodiment, the step of adapting comprises modifying the angular relationship between the determined electrical axis of the heart and the instantaneous vector of the vector cardiogram. By that, the tilting of the instantaneous electrical axis of the heart can readily be taken into account when determining the at least one parameter of the acquisition period, and a robust and reliable synchronization of the measurement of the magnetic resonance signal to the cyclic movement of the heart can be achieved.

A simple and effective way of taking the tilting of the instantaneous electrical axis of the heart into account can be accomplished if the modifying of the angular relationship between the determined electrical axis of the heart and the instantaneous vector of the vector cardiogram includes adjusting an angle formed by the determined electrical axis of the heart and the instantaneous vector of the vector cardiogram by a predetermined amount in case of a transition between a subject's breathing status of full expiration to a subject's status of full inspiration.

In another embodiment, the angle formed by the determined electrical axis of the heart and the instantaneous vector of the vector cardiogram is adjusted by an amount derived from an angular position of an instantaneous vector of the vector cardiogram with respect to the determined electrical axis of the heart from an earlier-determined parameter of the acquisition period. In this way, the shifted position of the electrical axis of the heart during breathing can readily be tracked by employing earlier-determined and significant shifting positions.

In another preferred embodiment, the method further comprises a step of calibrating, which is carried out prior to determining the at least one parameter of the acquisition period. In the step of calibrating, a predetermined amount for adjusting the angle formed by the determined electrical axis of the heart and the instantaneous vector of the vector cardiogram as the step of adapting the discriminating function is individually determined for the subject of interest from vector cardiogram data taken in the subject's breathing status of full expiration and the subject's status of full inspiration. In this way, individual differences between different subjects due to their varying body structure can be considered, resulting in a very precise synchronization of measurements of magnetic resonance signals to the cyclic movement of the heart of the subject of interest.

In yet another preferred embodiment of the method, the step of adapting the discriminating function comprises varying the angle formed by the determined electrical axis of the heart and the instantaneous vector of the vector cardiogram within a range of the predetermined amount in case of a transition between a subject's breathing status of full expiration to a subject's breathing status of full inspiration. In this way, a robust, synchronization of the measurement of the magnetic resonance signal to the cyclic movement of the heart can be accomplished for every status of respiration of the subject.

In another aspect of the invention, a magnetic resonance imaging system for acquisition of images of at least a portion of a human or animal subject of interest, synchronized to a cyclic movement of the heart of the subject of interest, is provided.

The magnetic resonance imaging system comprises a main magnet for generating a static magnetic field, a magnetic gradient coil system for generating gradient magnetic fields superimposed to the static magnetic field, and an examination space provided to position the subject of interest within.

The magnetic resonance imaging system further includes a control unit for controlling functions of the magnetic resonance imaging system. The control unit is coupled to a synchronization unit and is configured to be synchronized by trigger signals from the synchronization unit for a generation of control signals for the magnetic gradient coil system generating the gradient magnetic fields. Moreover, the control unit is configured to generate a plurality of sequences upon receiving the trigger signals, each sequence comprising radio frequency fields and magnetic gradient fields.

Furthermore, the magnetic resonance imaging system comprises an image processing unit provided for processing acquired magnetic resonance signals to determine an image of at least the portion of the subject of interest from the acquired magnetic resonance signals, an electrocardiogram device for taking measurements of electrocardiogram data of the heart of the subject of interest and configured to generate vector cardiogram data from the electrocardiogram data, including determining an electrical axis of the heart, and a synchronization unit coupled to the electrocardiogram device and configured for determining at least one parameter of an acquisition period of acquiring magnetic resonance signals from the vector cardiogram data, wherein the at least one parameter of the acquisition period is determined from an actual value of a discriminating function, which is based on an angular relationship between the determined electrical axis of the heart and an instantaneous vector of the vector cardiogram, and a predetermined reference function, which is based on a fixed threshold of the actual value of the discrimination function.

The synchronization unit is configured to provide trigger signals indicative of the determined at least one parameter of the acquisition period to the control unit, and to adapt at least one of the discriminating function and the predetermined reference function, dependent on a breathing status of the human or animal subject of interest.

In a further aspect of the invention, a software module for synchronizing measurement of magnetic resonance signals acquired by a magnetic resonance imaging system to a cyclic movement of a heart of a subject of interest according to one of the disclosed methods or a combination thereof is provided, wherein the steps are converted into a program code that is implementable in a memory unit of a synchronization unit of the magnetic resonance imaging system and that is executable by a processor unit of the synchronization unit.

BRIEF DESCRIPTION OF THE DRAWINGS

These and other aspects of the invention will be apparent from and elucidated with reference to the embodiments described hereinafter. Such embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
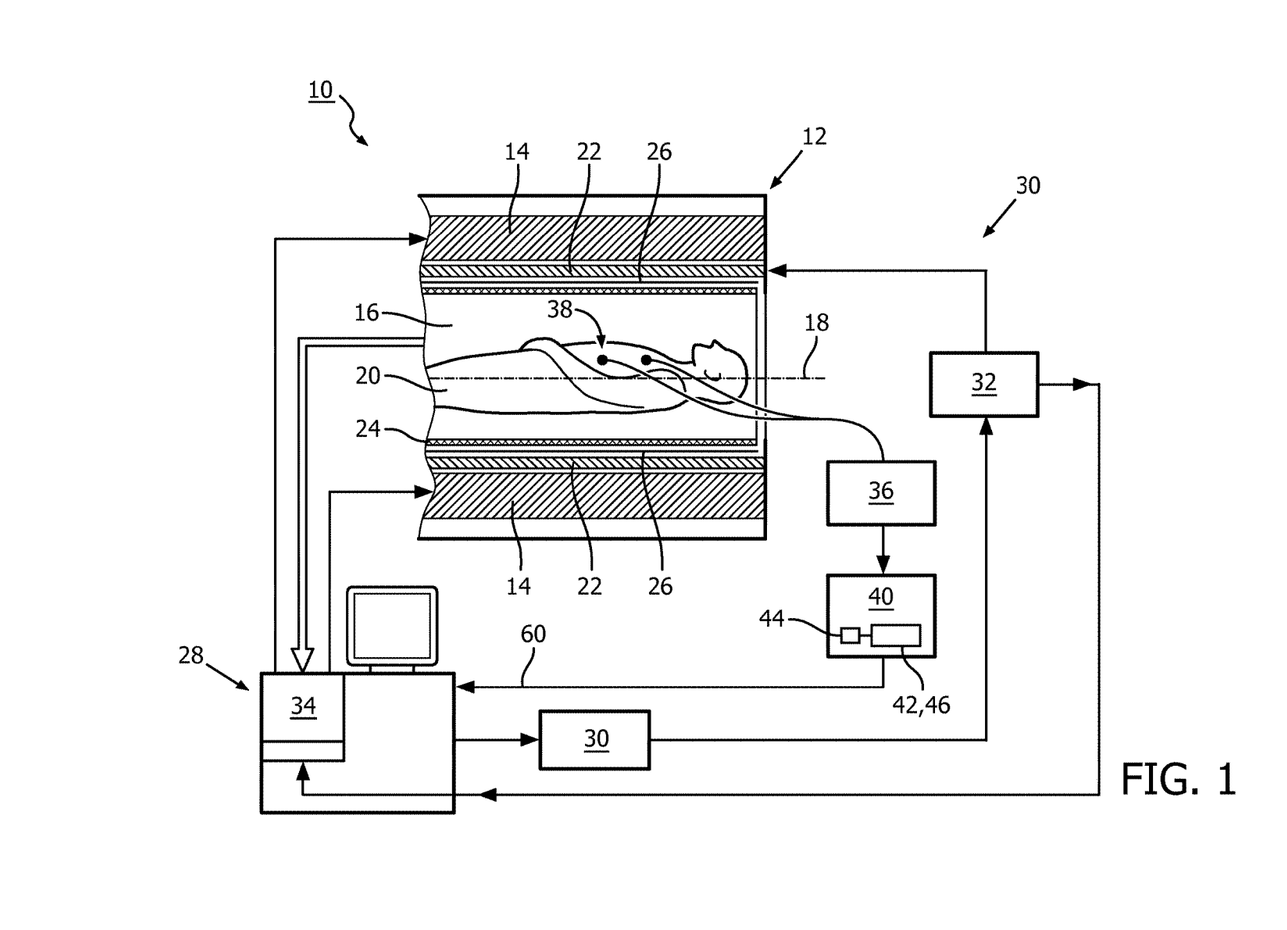
FIG. 1 is a schematic illustration of a part of an embodiment of a magnetic resonance imaging system in accordance with the invention.

FIG. 1 shows a schematic illustration of a part of an embodiment of a magnetic resonance imaging system 10 in accordance with the invention, for acquisition of magnetic resonance images of a portion of a human or animal subject of interest 20. In particular, the magnetic resonance imaging system 10 is configured for acquisition of magnetic resonance images of the heart of the human or animal subject of interest 20. The magnetic resonance imaging system 10 comprises a magnetic resonance scanner 12 having a main magnet 14 provided for generating a static magnetic field. The main magnet 14 has a central bore that provides an examination space 16 around a center axis 18 for the subject of interest 20, a human volunteer, to be positioned within. For clarity reasons, a conventional table for supporting the subject of interest 20 has been omitted in FIG. 1. The substantially static magnetic field defines an axial direction of the examination space 16, aligned in parallel to the center axis 18. Further, the magnetic resonance imaging system 10 includes a magnetic gradient coil system 22 provided for generating gradient magnetic fields superimposed to the static magnetic field. The magnetic gradient coil system 22 is concentrically arranged within the bore of the main magnet 14, as is known in the art.

Further, the magnetic resonance imaging system 10 comprises a radio frequency antenna 24 designed as a whole-body coil that is provided for applying a radio frequency magnetic field to the examination space 16 during radio frequency transmit phases to excite nuclei of the subject of interest 20. The radio frequency antenna 24 is also provided to receive magnetic resonance signals from the excited nuclei during radio frequency receive phases. In an operational state of the magnetic resonance imaging system 10, radio frequency transmit phases and radio frequency receive phases are taking place in a consecutive manner. The radio frequency antenna 24 has a center axis and, in the operational state, is arranged concentrically within the bore of the main magnet 14 such that the center axis of the radio frequency antenna 24 and the center axis 18 of the magnetic resonance imaging system 10 coincide. As is well known in the art, a cylindrical metal radio frequency screen 26 is arranged concentrically between the magnetic gradient coil system 22 and the radio frequency antenna 24.

The magnetic resonance imaging system 10 further includes a control unit 28 provided for controlling functions of the magnetic resonance scanner 12. Furthermore, the magnetic resonance imaging system 10 comprises a radio frequency transmitter unit 30 that is connected to and controlled by the control unit 28. The radio frequency transmitter unit 30 is provided to feed radio frequency power of a magnetic resonance radio frequency to the radio frequency antenna 24 via a radio frequency switching unit 32 during the radio frequency transmit phases. During radio frequency receive phases, the radio frequency switching unit 32 directs the magnetic resonance signals from the radio frequency antenna 24 to an image processing unit 34 residing in the control unit 28. The image processing unit 34 is configured for processing acquired magnetic resonance signals to determine a magnetic resonance image of the portion of the subject of interest 20 from the acquired magnetic resonance signals. Many different variations of this technique are well known to the person skilled in the art, and thus need not be described in further detail herein.

For the acquisition of magnetic resonance images of the heart of the subject of interest 20, the magnetic resonance imaging system 10 is further equipped with an electrocardiogram device 36 and a synchronization unit 40.

Figure 3:
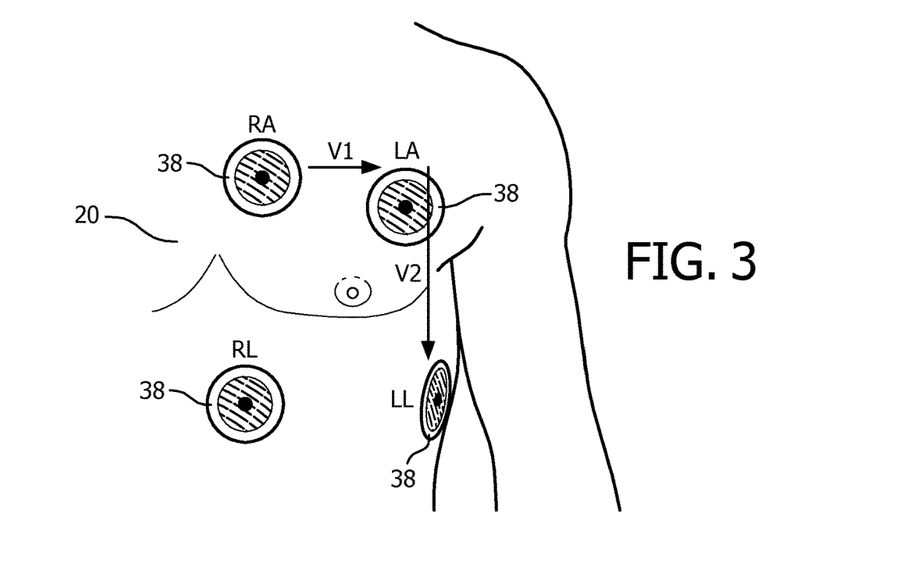
FIG. 3 illustrates an arrangement of electrodes of the electrocardiogram device of the magnetic resonance imaging system pursuant to FIG. 1.

The electrocardiogram device 36 is provided for taking measurements of the electrocardiogram data of the heart of the subject of interest 20 and is configured to generate vector cardiogram data from the electrocardiogram data, which includes determining an electrical axis of the heart. To this end, a plurality of electrodes 38 of the electrocardiogram device 36 may be arranged at the subject of interest 20 according to an orthogonal lead set, as shown in FIG. 3. Further, the electrocardiogram device 36 includes means for filtering the electrocardiogram data to reduce artifacts generated by magnetic gradient fields. Suitable filtering means are known to the person skilled in the art and shall therefore not be described in more detail herein.

The electrocardiogram device 36 is coupled to the synchronization unit 40, which is configured for determining a parameter of an acquisition period of acquiring magnetic resonance signals from the vector cardiogram data, as will be described in more detail later on. The synchronization unit 40, in turn, is coupled to the control unit 28. The control unit 28 is configured to be synchronized by trigger signals 60 that are provided by the synchronization unit 40, and that are indicative of the determined parameter of the acquisition period, for a generation of control signals for the magnetic gradient coil system 22 generating the gradient magnetic fields. To this end, the control unit 28 is configured to generate a plurality of sequences upon receiving the trigger signals 60, each sequence comprising radio frequency fields and magnetic gradient fields.

In the following, a method of determining the parameter of the acquisition period from the vector cardiogram data in order to synchronize measurement of magnetic resonance signals acquired by the magnetic resonance imaging system 10 to a cyclic movement of the heart of the subject of interest 20 is presented in detail.

The parameter of the acquisition period is determined by the synchronization unit 40. For this purpose, the synchronization unit 40 is furnished with a memory unit 42, a processor unit 44 and a software module 46 (FIG. 1), wherein steps of the method of determining are converted into a program code that is implemented in the memory unit 42 of the synchronization unit 40 and that is executable by the processor unit 44 of the synchronization unit.

In a first step of the method, measurements of electrocardiogram data of the heart of the subject of interest 20 are taken, for instance by using the orthogonal lead set shown in FIG. 3. In a next step, the electrocardiogram device 36 then generates vector cardiogram data (FIG. 2) from the electrocardiogram data and determines an electrical axis of the heart (later on termed "the determined electrical axis of the heart"), which is represented in the vector cardiogram by a vector (straight arrow) starting from the vector diagram origin and having an electrical axis direction 48.

Figure 2:
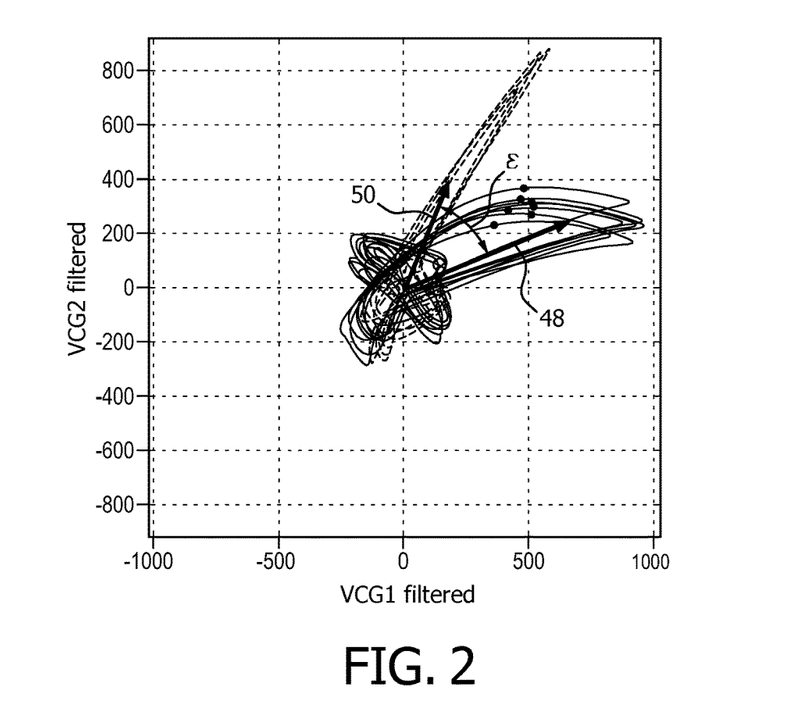
FIG. 2 illustrates a vector cardiogram at different situations of breathing.

An actual value of a discriminating function is calculated by the processor unit 44 of the synchronization unit 40 in a next step. The discriminating function is based on an angular relationship between the determined electrical axis of the heart and an instantaneous vector 50 of the vector cardiogram, and is in this particular embodiment defined as the scalar product of the instantaneous vector 50 of the vector cardiogram and the vector representing the determined electrical axis of the heart. This scalar product is thus given by the product of the magnitude of the instantaneous vector 50 of the vector cardiogram, the magnitude of the vector representing the determined electrical axis of the heart, and the cosine function of an angle ε that is formed by the electrical axis direction 48 of the determined electrical axis of the heart and the instantaneous vector 50 of the vector cardiogram.

The synchronization unit 40 is configured to compare the calculated actual value of the discriminating function to a predetermined reference function, which is based on a fixed threshold of the actual value of the discrimination function. In this particular embodiment, the predetermined reference function is given by 75% of a maximum amplitude of the discrimination function, wherein the maximum amplitude is determined during one loop of the instantaneous vector 50 in the vector cardiogram. In other embodiments, the predetermined reference function may be given by another percentage of the maximum amplitude of the discrimination function, or it may be non-constant and, e.g., may depend on the angle ε.

Figure 4:
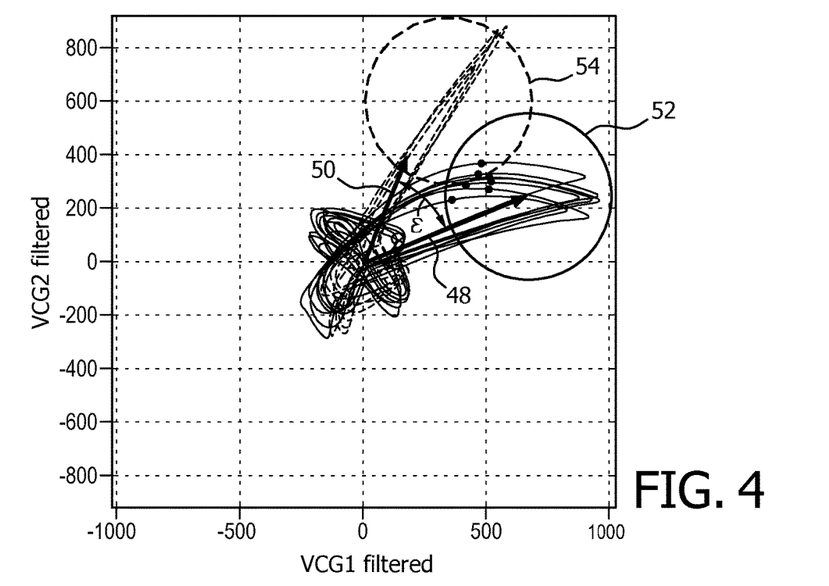
FIG. 4 illustrates a vector cardiogram with a trigger region adjusted in accordance with a first embodiment of the method of the invention.

This situation is illustrated in FIG. 4, which shows vector cardiogram data obtained from filtered electrocardiogram data. Whenever the condition of 75% of the maximum amplitude of the discrimination function during one loop of the instantaneous vector 50 is met, which is usually the case for the large R-peak of the QRS complex of the electrocardiogram, the synchronization unit 40 is configured to provide a trigger signal 60 to the control unit 28. The solid line circle in FIG. 4 represents a first trigger region 52 of the vector cardiogram in which the instantaneous vector 50 has to fall in order to meet the above-mentioned conditions.

As described above, the control unit 28 is synchronized by the trigger signals 60 from the synchronization unit 40 and generates control signals for the magnetic gradient coil system 22 upon receiving trigger signals 60, which thereby determines a parameter of an acquisition period for the magnetic resonance imaging system 10 given by a start time relative to the occurrence of the R-peak heart activity. In this way, it is ensured that magnetic resonance images are taken at the same phase of the cyclic movement of the heart of the subject of interest 20.

The solid-line loops in FIG. 4 represent an activity of the heart of the subject of interest 20 in a situation of normal, shallow breathing. The dashed-line loops in FIG. 4 represent the activity of the heart in the subject's breathing status of full inspiration and breath held. It is clearly visible from FIG. 4 that the instantaneous vector 50 describes loops outside the first trigger region 52 of the vector cardiogram, so that the above described condition would not be met, and the synchronization unit 40 would not provide any trigger signals 60 to the control unit 28.

In order to ensure proper synchronization also for the subject's breathing status of full inspiration and hold breath, the synchronization unit 40 is configured to adapt at least one of the discriminating function and the predetermined reference function, dependent on a breathing status of the human or animal subject of interest 20.

In a first embodiment of the method, the step of adapting comprises modifying the angular relationship between the determined electrical axis of the heart and the instantaneous vector 50 of the vector cardiogram. The modifying of the angular relationship between the determined electrical axis of the heart and the instantaneous vector 50 of the vector cardiogram includes adjusting the angle ε formed by the electrical axis direction 48 of the determined electrical axis of the heart and the instantaneous vector 50 of the vector cardiogram by a predetermined amount in case of a transition between a subject's breathing status of full expiration to a subject's status of full inspiration.

In the first embodiment of the step of adapting, the predetermined amount is −40°; i.e. the angle ε in the vector cardiogram formed by the determined electrical axis of the heart and the instantaneous vector 50 of the vector cardiogram is reduced by 40°. Numerically, this can be accomplished by rotating the determined electrical axis of the heart by 40° towards the instantaneous vector 50 of the vector cardiogram (counterclockwise in FIG. 4), and by leaving the predetermined reference function unchanged, which defines a second trigger region 54 in the vector cardiogram. A practical way for rotating the determined electrical heart axis of the heart would be to apply a two-dimensional rotational matrix with an angle of rotation of −40° to the two variables of the vector cardiogram. As can be recognized from FIG. 4, the instantaneous vectors 50 of the vector cardiogram in the subject's breathing status of full inspiration to a great extent fall into the second trigger region 54 of the vector cardiogram that is indicated by a dashed-line circle, so that a proper synchronization of magnetic resonance images and the cyclic movement of the heart of the subject of interest 20 can be insured.

In a second embodiment of the step of adapting, an angle ε formed by the determined electrical axis of the heart and an instantaneous vector 50 of a vector cardiogram is adjusted by an amount derived from an angular position of an instantaneous vector 50 of the vector cardiogram with respect to the determined electrical axis of the heart from an earlier-determined parameter of an acquisition period. In this embodiment, which requires a higher effort of data analysis, the shifting of the actual electrical axis of the heart can be tracked by and by, usually by tracking the R-peak of the QRS complex of the electrocardiogram, which results in an excellent synchronization of magnetic resonance images and a cyclic movement of the heart of the subject of interest 20. In the vector cardiogram of FIG. 5, the shifting of the actual electrical axis of the heart is reflected in continuously moving circular third trigger regions $56_1$ to $56_n$, which are indicated by a number of circles for a number of corresponding given instants.

In a third embodiment, the method further comprises, prior to determining a parameter of an acquisition period, a step of calibrating, wherein a predetermined amount for adjusting the angle ε formed by the determined electrical axis of the heart and the instantaneous vector 50 of the vector cardiogram, which can be used in the step of adapting the discriminating function after the calibrating, is individually determined for the subject of interest 20 from vector cardiogram data taken in the subject's breathing status of full expiration and the subject's status of full inspiration.

Table 1 shows experimental results for determining an actual electrical axis of the heart for various changes between an individual subject's breathing status of full expiration and the subject's status of full inspiration. Although the results show a subject-specific variance, an average of about 30° has been obtained, and can be used for adjusting the angle ε formed by the determined electrical axis of the heart and the instantaneous vector 50 of the vector cardiogram.

By other experimental data it has been confirmed that a magnitude of a reference instantaneous vector of vector cardiograms obtained during normal breathing and obtained in the subject's status of full inspiration with breath hold does not significantly change, so that for many cases the predetermined reference function may remain unchanged.

TABLE 1

| file name | average angle of rotation of R-peaks in vector cardiogram during breath holds compared to normal breathing during the calibration phase |
|---|---|
| SCANPHYSLOG201 XX1.log | 47.3° |
| SCANPHYSLOG201 XX2.log | 44.1° |
| SCANPHYSLOG201 XX3.log | 26.9° |
| SCANPHYSLOG201 XX4.log | 43.9° |
| SCANPHYSLOG201 XX5.log | 20.0° |
| SCANPHYSLOG201 XX6.log | 14.9° |
| SCANPHYSLOG201 XX7.log | 17.2° |
| SCANPHYSLOG201 XX8.log | 40.9° |
| SCANPHYSLOG201 XX9.log | 8.2° |
| SCANPHYSLOG201 XX10.log | 42.5° |
| SCANPHYSLOG201 XX11.log | 30.7° |
| SCANPHYSLOG201 XX12.log | 22.5° |
| MEAN ANGLE OF ROTATION | +29.9° |

Figure 5:
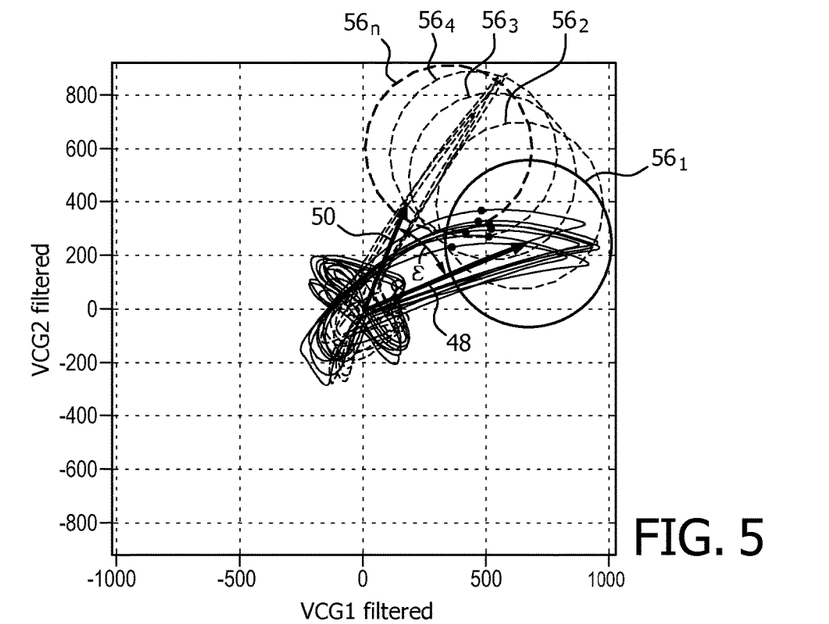
FIG. 5 illustrates a vector cardiogram with a trigger region adjusted in accordance with another embodiment of the method.
Figure 6:
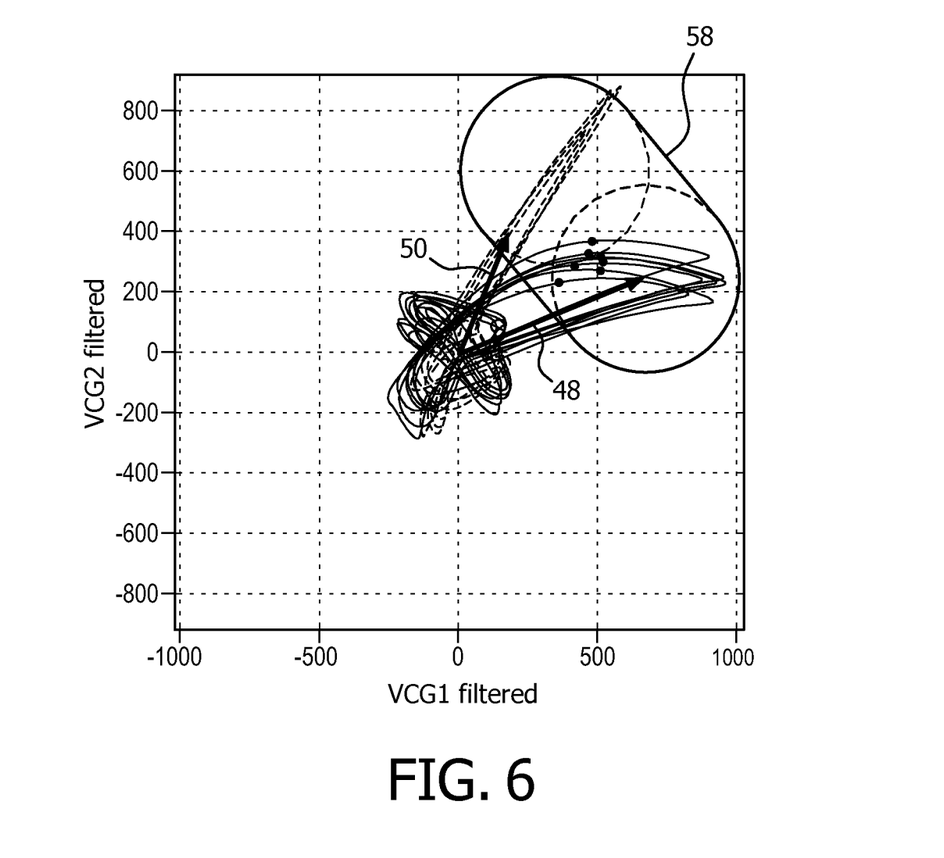
FIG. 6 illustrates a vector cardiogram with a trigger region adjusted in accordance with yet another embodiment of the method.

However, it can be necessary to adjust the predetermined reference function in the case of certain heart diseases, or for fine-tuning the trigger region 52, 54, 56 in the case of a higher precision requirement for synchronization.

In a fourth embodiment of the method, the step of adapting the discriminating function comprises varying the angle ε formed by the determined electrical axis of the heart and the instantaneous vector 50 of the vector cardiogram within a range of the predetermined amount in case of a transition between a subject's breathing status of full expiration to a subject's breathing status of full inspiration. In the vector cardiogram of FIG. 6, this is reflected by an extension of a trigger region from an initial circle to a fourth trigger region 58 that is represented by an area generated by a rotation of the initial circle about an axis through the vector cardiogram origin and perpendicular to its plane. The enlarged fourth trigger region 58 ensures a reliable determining of at least one parameter of an acquisition period from the vector cardiogram data.

In principle, the disclosed invention is also applicable to any other type of magnetic resonance imaging system that provides an examination region within a static magnetic field, for instance an open C-shape magnetic resonance imaging system, and that is equipped with the auxiliary units and devices as described herein as being required to carry out an embodiment of the disclosed methods or a combination thereof.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST 10 magnetic resonance imaging system
12 magnetic resonance scanner
14 main magnet
16 examination space
18 center axis
20 subject of interest
22 magnetic gradient coil system
24 radio frequency antenna
26 radio frequency screen
28 control unit
30 radio frequency transmitter unit
32 radio frequency switching unit
34 image processing unit
36 electrocardiogram device
38 electrode
40 synchronization unit
42 memory unit
44 processor unit
46 software module
48 electrical axis direction
50 instantaneous vector
52 first trigger region
54 second trigger region
56 third trigger region
58 fourth trigger region
60 trigger signal
ε angle

The invention claimed is:

1. A method of imaging, by means of magnetic resonance, at least a portion of a human or animal subject of interest positioned in a static magnetic field, the method comprising:
taking measurements of electrocardiogram data of a heart of the subject of interest;
generating vector cardiogram data from the electrocardiogram data including determining an electrical axis of the heart;
determining at least one parameter of an acquisition period of acquiring magnetic resonance signals from the vector cardiogram data in order to synchronize measurement of magnetic resonance signals to a cyclic movement of the heart of the subject of interest; wherein the at least one parameter of acquisition period is determined from an actual value of a discriminating function, which is based on an angular relationship between the determined electrical axis of the heart and an instantaneous vector of the vector cardiogram, and a predetermined reference function, which is based on a fixed threshold of the actual value of the discrimination function, wherein determining the at least one parameter of the acquisition period includes a step of adapting at least one of the discriminating function and the predetermined reference function is executed, dependent on a breathing status of the human or animal subject of interest, wherein the step of adapting includes modifying the angular relationship between the determined electrical axis of the heart and the instantaneous vector of the vector cardiogram.

2. The method of claim 1, wherein the modifying of the angular relationship between the determined electrical axis of the heart and the instantaneous vector of the vector cardiogram includes adjusting an angle (e) formed by the determined electrical axis of the heart and the instantaneous vector of the vector cardiogram by a predetermined amount in case of a transition between a subject's breathing status of full expiration to a subject's status of full inspiration.

3. The method of claim 1, wherein an angle (e) formed by the determined electrical axis of the heart and the instantaneous vector of the vector cardiogram is adjusted by an amount derived from an angular position of an instantaneous vector of the vector cardiogram with respect to the determined electrical axis of the heart from an earlier-determined parameter of an acquisition period.

4. The method of claim 1, further comprising, prior to determining the at least one parameter of the acquisition period, a step of calibrating, wherein a predetermined amount for adjusting an angle (e) formed by the determined electrical axis of the heart and the instantaneous vector of the vector cardiogram as the step of adapting the discriminating function is individually determined for the subject of interest from vector cardiogram data taken in the subject's breathing status of full expiration and the subject's status of full inspiration.

5. The method as of claim 1, wherein the step of adapting the discriminating function comprises varying an angle (e) formed by the determined electrical axis of the heart and the instantaneous vector of the vector cardiogram within a range of the predetermined amount in case of a transition between a subject's breathing status of full expiration to a subject's breathing status of full inspiration.

6. A magnetic resonance imaging system for acquisition of images of at least a portion of a human or animal subject of interest, synchronized to a cyclic movement of the heart of the subject of interest, comprising:
a main magnet for generating a static magnetic field;
a magnetic gradient coil system for generating gradient magnetic fields superimposed to the static magnetic field;
an examination space provided to position the subject of interest within;
a control unit for controlling functions of the magnetic resonance imaging system, wherein the control unit is coupled to a synchronization unit and is configured to be synchronized by trigger signals from the synchronization unit for a generation of control signals for the magnetic gradient coil system generating the gradient magnetic fields, and wherein the control unit is configured to generate a plurality of sequences upon receiving the trigger signals, each sequence comprising radio frequency fields and magnetic gradient fields;
an image processing unit provided for processing acquired magnetic resonance signals to determine an image of at least the portion of the subject of interest from the acquired magnetic resonance signals;
an electrocardiogram device for taking measurements of electrocardiogram data of the heart of the subject of interest and configured to generate vector cardiogram data from the electrocardiogram data, including determining an electrical axis of the heart;
a synchronization unit coupled to the electrocardiogram device and configured for determining at least one parameter of an acquisition period of acquiring magnetic resonance signals from the vector cardiogram data, wherein the at least one parameter of the acquisition period is determined from an actual value of a discriminating function, which is based on an angular relationship between the determined electrical axis of the heart and an instantaneous vector of the vector cardiogram, and a predetermined reference function, which is based on a fixed threshold of the actual value of the discrimination function, wherein the synchronization unit is configured to provide the trigger signals indicative of the determined at least one parameter of the acquisition period to the control unit; and
wherein the synchronization unit is configured to adapt at least one of the discriminating function and the predetermined reference function, dependent on a breathing status of the human or animal subject of interest, wherein adapting includes modifying the angular relationship between the determined electrical axis of the heart and the instantaneous vector of the vector cardiogram.

7. A software module for synchronizing measurement of magnetic resonance signals acquired by a magnetic resonance imaging system to a cyclic movement of a heart of a subject of interest according to the method as claimed in claim 1, wherein the steps are converted into a program code that is implementable in a memory unit of a synchronization unit of the magnetic resonance imaging system and that is executable by a processor unit of the synchronization unit.

8. The magnetic resonance imaging of claim 6, wherein the at least one parameter of acquisition period is determined by the synchronization unit to synchronize measurement of acquiring magnetic resonance signals to the cyclic movement of the heart of the human or animal subject of interest.

9. The magnetic resonance imaging system of claim 6, wherein the modifying of the angular relationship between the determined electrical axis of the heart and the instantaneous vector of the vector cardiogram includes adjusting an angle (e) formed by the determined electrical axis of the heart and the instantaneous vector of the vector cardiogram by a predetermined amount in case of a transition between a subject's breathing status of full expiration to a subject's status of full inspiration.

10. The magnetic resonance imaging system of claim 6, wherein an angle (e) formed by the determined electrical axis of the heart and the instantaneous vector of the vector cardiogram is adjusted by an amount derived from an angular position of an instantaneous vector of the vector cardiogram with respect to the determined electrical axis of the heart from an earlier-determined parameter of an acquisition period.

11. The magnetic resonance imaging system of claim 6, further comprising, prior to determining the at least one parameter of the acquisition period, a step of calibrating, wherein a predetermined amount for adjusting an angle (e) formed by the determined electrical axis of the heart and the instantaneous vector of the vector cardiogram as the step of adapting the discriminating function is individually determined for the subject of interest from vector cardiogram data taken in the subject's breathing status of full expiration and the subject's status of full inspiration.

12. The magnetic resonance imaging system of claim 6, wherein the step of adapting the discriminating function comprises varying an angle (e) formed by the determined electrical axis of the heart and the instantaneous vector of the vector cardiogram within a range of the predetermined amount in case of a transition between a subject's breathing status of full expiration to a subject's breathing status of full inspiration.

13. A non-transitory computer readable medium carrying program instructions to cause a processor to perform a method of synchronizing measurement of magnetic resonance signals acquired by a magnetic resonance imaging system to a cyclic movement of a heart of a subject of interest by controlling the processor, the method comprising:
    taking measurements of electrocardiogram data of a heart of the subject of interest;
    generating vector cardiogram data from the electrocardiogram data including determining an electrical axis of the heart;
    determining at least one parameter of an acquisition period of acquiring magnetic resonance signals from the vector cardiogram data in order to synchronize measurement of magnetic resonance signals to a cyclic movement of the heart of the subject of interest;
    wherein the at least one parameter of acquisition period is determined from an actual value of a discriminating function, which is based on an angular relationship between the determined electrical axis of the heart and an instantaneous vector of the vector cardiogram, and a predetermined reference function, which is based on a fixed threshold of the actual value of the discrimination function, wherein determining the at least one parameter of the acquisition period includes a step of adapting at least one of the discriminating function and the predetermined reference function is executed, dependent on a breathing status of the human or animal subject of interest, wherein the step of adapting includes modifying the angular relationship between the determined electrical axis of the heart and the instantaneous vector of the vector cardiogram.

14. The non-transitory computer readable medium of claim 13, wherein the modifying of the angular relationship between the determined electrical axis of the heart and the instantaneous vector of the vector cardiogram includes adjusting an angle (e) formed by the determined electrical axis of the heart and the instantaneous vector of the vector cardiogram by a predetermined amount in case of a transition between a subject's breathing status of full expiration to a subject's status of full inspiration.

15. The non-transitory computer readable medium of claim 13, wherein an angle (e) formed by the determined electrical axis of the heart and the instantaneous vector of the vector cardiogram is adjusted by an amount derived from an angular position of an instantaneous vector of the vector cardiogram with respect to the determined electrical axis of the heart from an earlier-determined parameter of an acquisition period.

16. The non-transitory computer readable medium of claim 13, further comprising, prior to determining the at least one parameter of the acquisition period, a step of calibrating, wherein a predetermined amount for adjusting an angle (e) formed by the determined electrical axis of the heart and the instantaneous vector of the vector cardiogram as the step of adapting the discriminating function is individually determined for the subject of interest from vector cardiogram data taken in the subject's breathing status of full expiration and the subject's status of full inspiration.

17. The non-transitory computer readable medium of claim 13, wherein the step of adapting the discriminating function comprises varying an angle (e) formed by the determined electrical axis of the heart and the instantaneous vector of the vector cardiogram within a range of the predetermined amount in case of a transition between a subject's breathing status of full expiration to a subject's breathing status of full inspiration.

18. A magnetic resonance imaging system for acquisition of images of at least a portion of a human or animal subject of interest, synchronized to a cyclic movement of the heart of the subject of interest, comprising:
    a main magnet for generating a static magnetic field;
    a magnetic gradient coil system for generating gradient magnetic fields superimposed to the static magnetic field;
    an examination space provided to position the subject of interest within;
    a control unit for controlling functions of the magnetic resonance imaging system, wherein the control unit is coupled to a synchronization unit and is configured to be synchronized by trigger signals from the synchronization unit for a generation of control signals for the magnetic gradient coil system generating the gradient magnetic fields, and wherein the control unit is configured to generate a plurality of sequences upon receiving the trigger signals, each sequence comprising radio frequency fields and magnetic gradient fields;
    an image processing unit provided for processing acquired magnetic resonance signals to determine an image of at least the portion of the subject of interest from the acquired magnetic resonance signals;
    an electrocardiogram device for taking measurements of electrocardiogram data of the heart of the subject of interest and configured to generate vector cardiogram data from the electrocardiogram data, including determining an electrical axis of the heart;
    a synchronization unit coupled to the electrocardiogram device and configured for determining at least one parameter of an acquisition period of acquiring magnetic resonance signals from the vector cardiogram data, wherein the at least one parameter of the acquisition period is determined from an actual value of a discriminating function, which is based on an angular relationship between the determined electrical axis of the heart and an instantaneous vector of the vector cardiogram, and a predetermined reference function, which is based on a fixed threshold of the actual value of the discrimination function, wherein the synchronization unit is configured to provide the trigger signals indicative of the determined at least one parameter of the acquisition period to the control unit; and
    wherein the an angle (e) formed by the determined electrical axis of the heart and the instantaneous vector of the vector cardiogram is adjusted by an amount derived from an angular position of an instantaneous vector of the vector cardiogram with respect to the determined electrical axis of the heart from an earlier-determined parameter of an acquisition period.

19. A magnetic resonance imaging system for acquisition of images of at least a portion of a human or animal subject of interest, synchronized to a cyclic movement of the heart of the subject of interest, comprising:
   a main magnet for generating a static magnetic field;
   a magnetic gradient coil system for generating gradient magnetic fields superimposed to the static magnetic field;
   an examination space provided to position the subject of interest within;
   a control unit for controlling functions of the magnetic resonance imaging system, wherein the control unit is coupled to a synchronization unit and is configured to be synchronized by trigger signals from the synchronization unit for a generation of control signals for the magnetic gradient coil system generating the gradient magnetic fields, and wherein the control unit is configured to generate a plurality of sequences upon receiving the trigger signals, each sequence comprising radio frequency fields and magnetic gradient fields;
   an image processing unit provided for processing acquired magnetic resonance signals to determine an image of at least the portion of the subject of interest from the acquired magnetic resonance signals;
   an electrocardiogram device for taking measurements of electrocardiogram data of the heart of the subject of interest and configured to generate vector cardiogram data from the electrocardiogram data, including determining an electrical axis of the heart;
   a synchronization unit coupled to the electrocardiogram device and configured for determining at least one parameter of an acquisition period of acquiring magnetic resonance signals from the vector cardiogram data, wherein the at least one parameter of the acquisition period is determined from an actual value of a discriminating function, which is based on an angular relationship between the determined electrical axis of the heart and an instantaneous vector of the vector cardiogram, and a predetermined reference function, which is based on a fixed threshold of the actual value of the discrimination function, wherein the synchronization unit is configured to provide the trigger signals indicative of the determined at least one parameter of the acquisition period to the control unit; and
   wherein the synchronization unit is configured to prior to determining the at least one parameter of the acquisition period, a step of calibrating, wherein a predetermined amount for adjusting the an angle (e) formed by the determined electrical axis of the heart and the instantaneous vector of the vector cardiogram as the step of adapting the discriminating function is individually determined for the subject of interest from vector cardiogram data taken in the subject's breathing status of full expiration and the subject's status of full inspiration.

* * * * *